United States Patent [19]

Liebl

[11] Patent Number: 4,551,599
[45] Date of Patent: Nov. 5, 1985

[54] COMBINED ELECTROSTATIC OBJECTIVE AND EMISSION LENS

[75] Inventor: Helmut Liebl, Eching, Fed. Rep. of Germany

[73] Assignee: Max-Planck-Gesellschaft zur Fürderung der Wissenschaften e.V., Göttingen, Fed. Rep. of Germany

[21] Appl. No.: 525,413

[22] Filed: Aug. 22, 1983

[30] Foreign Application Priority Data

Aug. 20, 1982 [DE] Fed. Rep. of Germany ....... 3231036

[51] Int. Cl.[4] .............................................. H01J 37/26
[52] U.S. Cl. ................................ 250/396 R; 250/398; 250/310
[58] Field of Search ............... 250/310, 309, 305, 396, 250/397

[56] References Cited

U.S. PATENT DOCUMENTS 3,845,305 10/1974 Liebl .................................. 250/310
4,255,661 3/1981 Liebl .................................. 250/310

OTHER PUBLICATIONS

"Combined Electrostatic Objective and Emission Lenses for Microcharacterization of Surfaces", Liebl, International J. of Mass Spectrometry and Ion Physics, No. 46, 1983, pp. 511–514.

Primary Examiner—Bruce C. Anderson
Attorney, Agent, or Firm—Spencer & Frank

[57] ABSTRACT

A combined objective and emission lens for a microbeam probe is described which is suitable for primary and secondary particles of the same charge sign, by which lens a bundle of primary rays of comparatively high energy can be focused on a very small spot of a plane sample surface and the secondary particles emitted by this spot can be collected into a collimated bundle of secondary rays which leaves the combined lens in a direction substantially opposite to the bundle of primary rays. In the present combined lens, the field strength between the sample surface and the lens electrode most closely adjacent to it is very high, in contrast to the known combined objective and emission lenses, so that a small emissivity of the secondary beam with a small diameter at the same time of the primary beam spot and an effective collection and collimation of the secondary particles are ensured. Certain embodiments can be changed over optionally to operation with primary and secondary particles of the same or opposite polarity.

6 Claims, 7 Drawing Figures

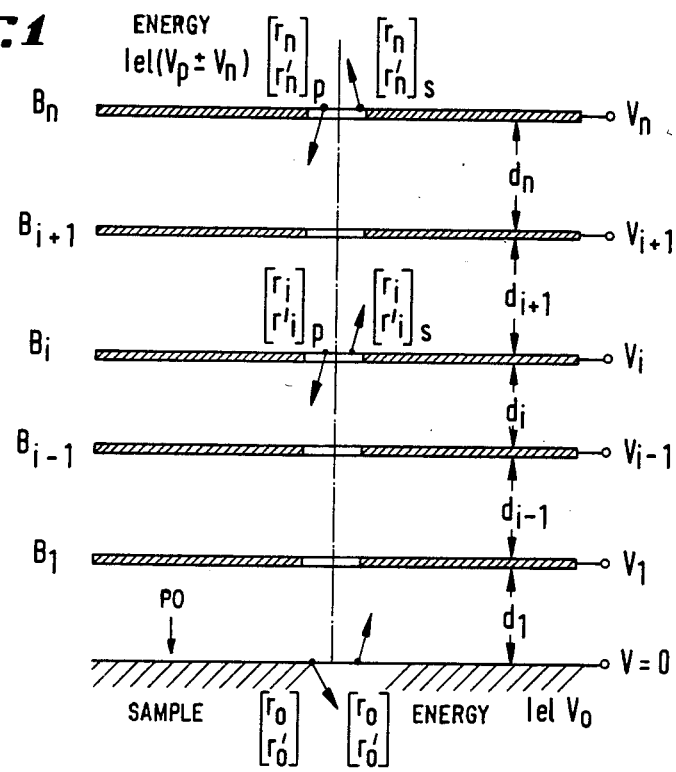
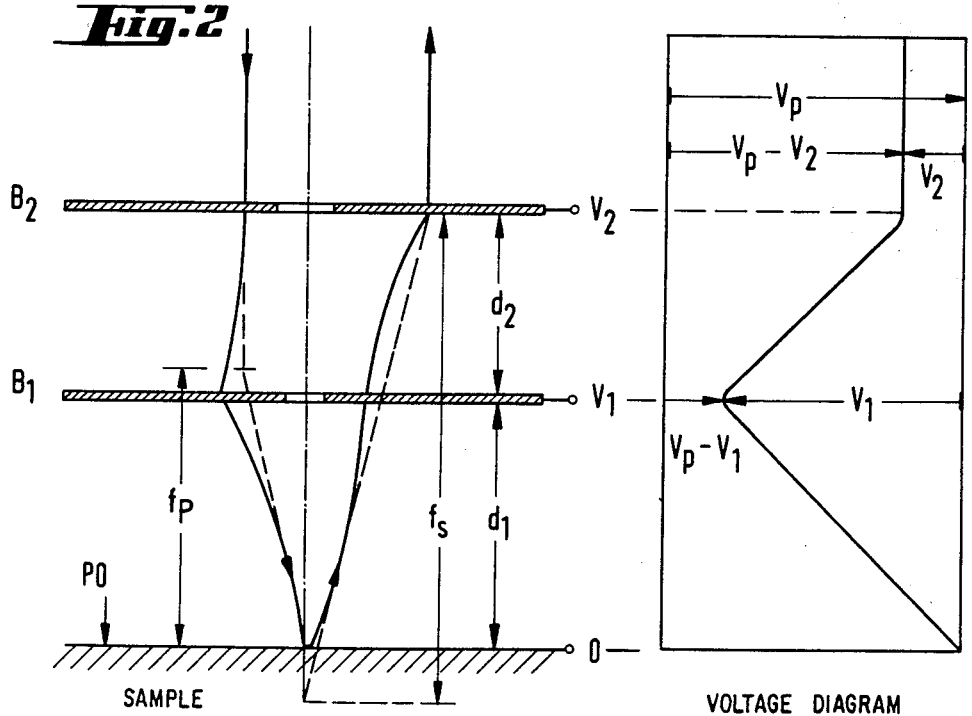

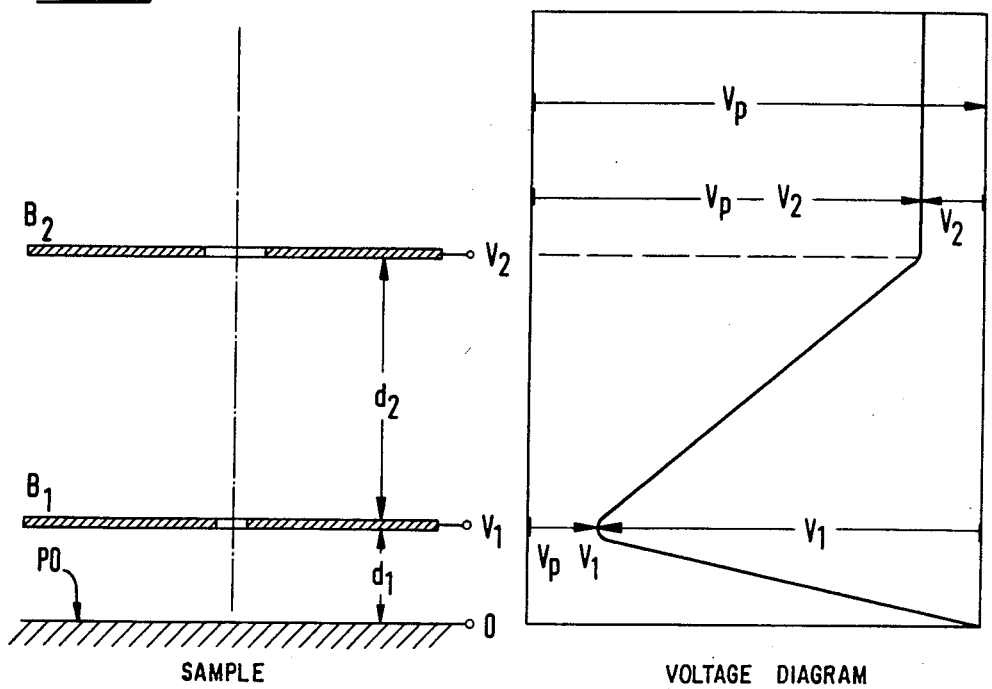
Fig. 3 SAMPLE / VOLTAGE DIAGRAM
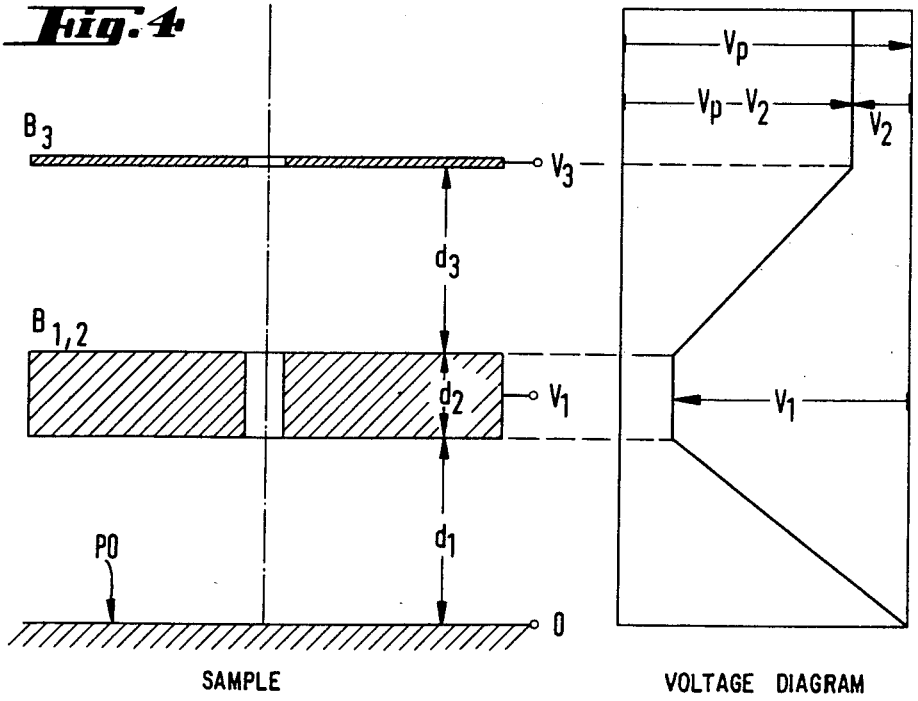
Fig. 4 SAMPLE / VOLTAGE DIAGRAM

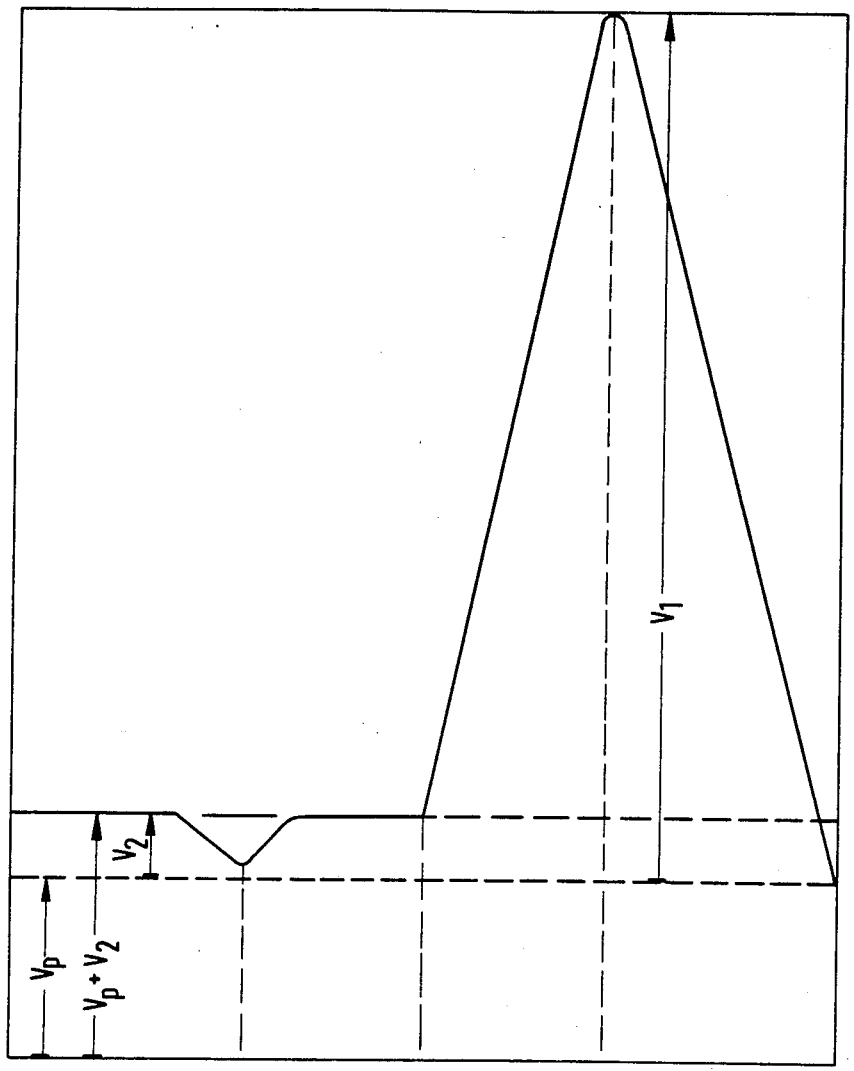
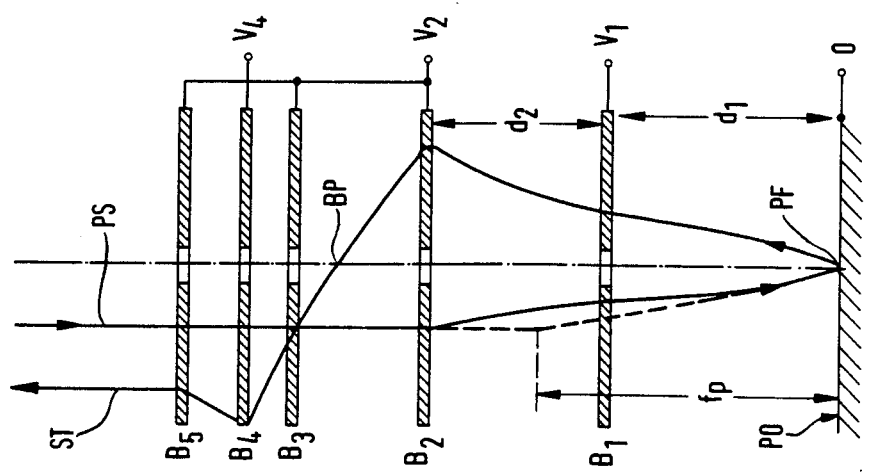
Fig. 5

COMBINED ELECTROSTATIC OBJECTIVE AND EMISSION LENS

BACKGROUND OF THE INVENTION

The present invention relates to a combined electrostatic objective and emission lens system for a particle-optical instrument, such as a microbeam probe for SIMS, which system includes a plurality of electrodes, each coupled to a respective source of potential and, in cooperation with a conductive sample surface, focuses a bundle of primary rays on a small spot of the sample surface and collimates the secondary particles emitted by this spot into a bundle of secondary rays which leaves the electrode system in a direction substantially opposite to the bundle of primary rays.

Methods of investigating surfaces and solids with the aid of charged particles (electrons, ions) are acquiring increasing importance, in particular in the fields of materials research, metallography, solid-state physics, semiconductor technology, geochemistry, biochemistry and protection of the environment.

One of these methods is secondary ion mass spectroscopy (SIMS), which is distinguished by particularly high sensitivity, applicability to all elements with simultaneous isotope separation and the possibility of microanalysis.

In the investigation of a narrowly limited surface area of a sample (microanalysis) by SIMS, a primary beam is precisely focused on the surface of the sample by means of an electrostatic objective lens. Arrangements in which the secondary ions produced are carried out backwards through the objective lens prove to be particularly advantageous with a view to the attainment of the smallest primary beam diameters in association with high current density. A microbeam probe of this type is known from Federal Republic of Germany Published Patent Application No. 22 23 367, published Nov. 11, 1973.

The above-mentioned microbeam probe contains an objective with two serially arranged electrostatic lenses with rotation symmetry and of short focal length, and a diaphragm arranged between them. The surface to be examined is electrically conductive. The lenses and the surface to be examined are so arranged and biased as regards the energy of the bundle of primary rays that this bundle of rays is focused on the area of the sample by the combined action of the electric fields of the two lenses, the diaphragm acting as a stop for the bundle of primary rays and the secondary particles produced in the area of the sample being focused at the same time into the opening of the diaphragm by the lens formed by the electrodes of the second lens and the conductive surface. Between the primary ray source and the objective there is disposed an arrangement for producing a deflecting field which separates the bundle of primary rays and the bundle of secondary rays by reason of the different energies of the particles of these bundles. In this known microbeam probe, the electrostatic lens adjacent the surface of the sample must have a small focal length, so that in the known construction only small field strengths are admissible at the surface of the sample. This is disadvantageous, since in an electrostatic emission lens the virtual (apparent) diameter of an emitting point is proportional to the quotient of the initial energy of the secondary particles to the field strength at the surface. The higher the field strength at the surface, the better is the emittance of the bundle of secondary rays, i.e. the product of the virtual diameter and the angle of aperture of the bundle of secondary rays starting from this point.

It is true that from Federal Republic of Germany Published Patent Application No. 28 42 527, published Apr. 3, 1980, an electrostatic emission lens is already known wherein the field strength at the electrically conductive surface of the sample is limited, practically speaking, only by the breakdown field-strength of the section between the surface of the sample and the first lens electrode following on this surface. This known emission lens is not, however, employed as an objective lens for focusing the primary beam, but on the contrary, the latter is introduced laterally at a relatively large angle to the axis of the emission lens through additional apertures in the electrodes.

The most important disadvantage of the above-mentioned known lenses consists, however, in that the primary particles and the secondary particles must have charges of opposite signs.

SUMMARY OF THE INVENTION

Accordingly, the problem underlying the present invention is to provide a combined electrostatic objective and emission lens which is suitable for primary and secondary particles with charges of the same sign and with which both the primary beam can be finely or precisely focused on the surface of the sample and the secondary ions produced can be concentrated and carried out, an optimally small emittance of the secondary beam being ensured by a maximum field strength limited practically speaking only by the breakdown strength of the section adjoining the sample surface.

This problem is solved by a combined electrostatic objective and emission lens system for a particle-optical instrument, such as a microbeam probe for SIMS, with the system including a plurality of electrodes coupled in each case to a source of potential, and which, in cooperation with a conductive sample surface, focuses a bundle of primary rays on a small spot of the sample surface and collimates the secondary particles emitted by this spot into a bundle of secondary rays which leaves the electrode system in a direction substantially opposite to the bundle of primary rays; wherein the system comprises the combination of:

(a) a first electrode arrangement disposed adjacent the sample surface and having a first electrode which is immediately opposite the sample surface at a first given distance and has such a potential that the electric field strength between it and the sample surface is at least about 40% of the vacuum breakdown field strength, and at least a second electrode arranged at a given second distance from the first electrode on the side on this electrode facing away from the sample surface and at a second potential with respect to the sample surface, the first and second distances and potentials being so proportioned that the bundle of primary rays accelerated by a given accelerating voltage is focused on a spot of the sample surface and the bundle of secondary rays emanating from this spot is focused into an intermediate image in an image plane located on that side of the first electrode arrangement which faces away from the sample surface, at a close distance from its last electrode; and, (b) a second electrode arrangement forming an einzel lens, whose focal plane, on the side where the sample surface is located, coincides substantially with the image plane of the intermediate image.

Further developments and a number of advantageous forms of the combined lens according to the invention are disclosed.

The combined electrostatic objective and emission lens according to the invention can be employed for primary and secondary particles of the same charge sign and is distinguished by a very small emittance of the bundle of secondary rays, since the field strength at the surface of the sample is limited only by the breakdown field strength between the surface of the sample and the electrode adjacent this surface. The combined lens is traversed axially by the primary beam, so that this can be focused very precisely. The high suction field between the surface of the sample and the first lens electrode ensures not only an optimum resolving power, but also minimum image aberrations.

Embodiments of the combined electrostatic objective and emission lens according to the invention which are preferred as regards their versatility of application are simple to change over, so that investigations with primary and secondary particles of the same or opposite sign can be carried out optionally without changing the geometrical conditions.

An aperture stop or diaphragm arranged within the electrode system, such as is required in the lens system known from the above mentioned Federal Republic of Germany Published Patent Application No. 22 23 367, is not needed in the present combined lens.

BRIEF DESCRIPTION OF THE DRAWINGS

The invention is described in detail hereinafter with reference to the drawings, wherein:

FIG. 1 is a diagrammatic representation of an electrode system for illustrating the charged particle-optical principles on which the present invention is based;

FIGS. 2, 3 and 4 are diagrammatic representations of the electrode arrangements and, alongside on the right, of the associated potential schemes of three lens systems which, in each case, contain only two electrodes and are suitable for particles of opposite polarities;

FIG. 5 is a representation corresponding to FIG. 2 of an embodiment of the invention suitable for primary and secondary particles of the same polarity.

DETAILED DESCRIPTION OF THE PREFERRED EMBODIMENTS

Figure 6A:
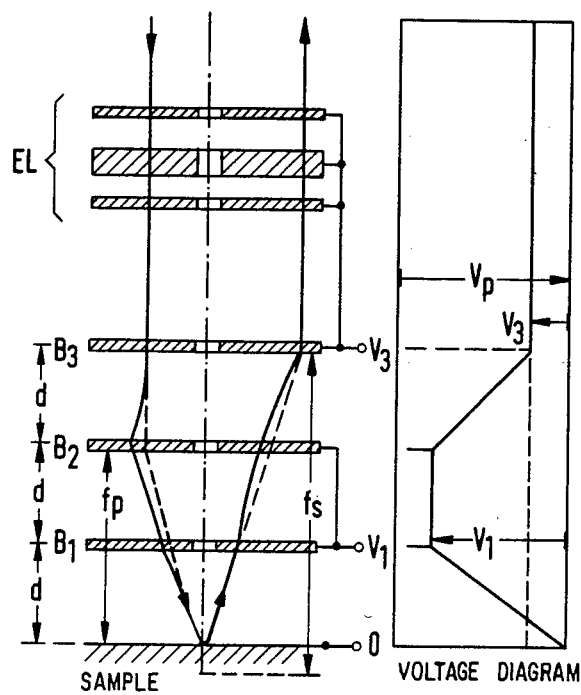
FIGS. 6a and 6b are representations in each case in accordance with FIG. 2 of an embodiment of the invention which can be changed over optionally to operation with particles of opposite or the same polarity, the conditions for operation with particles of opposite polarities being shown in FIG. 6a and the conditions for operation with particles of the same polarity being shown in FIG. 6b.

With reference to FIG. 1, the present combined electrostatic objective and emission lens contains an electrode arrangement adjacent to electrically conductive sample surface PO in the form of a set of diaphragm-like electrodes $B_1, \ldots B_i, \ldots B_n$ which may each be thin or thick, may be plane or possess rotation symmetry in another way, for example be conical, are arranged with their apertures coaxially along a lens axis perpendicular to the sample surface (assumed to be plane), and are at suitable potentials in operation. The index i indicates the sequence of the electrodes, $i=1$ designating the electrode most closely adjacent the sample surface PO and $i=n$ designating the electrode most removed from the sample surface PO. As regards to potentials, it is to be assumed that the sample surface is at a datum or reference potential ($V=O$).

An essential feature of the present combined objective and emission lens consists in that the distance and the potential difference between the sample surface PO and the first electrode $B_1$ are so chosen that the resultant electric field strength is very high, i.e. at least about equal to 40%, preferably at least 50%, of the vacuum breakdown field strength or dielectric strength (about 10 kV/mm).

The lens focuses a parallel bundle of primary rays of relatively high energy (particle energy, for example, of the order of magnitude of some $10^3$ eV) in a spot of small diameter of the sample surface PO and the charged secondary particles emitted from this spot, which are of low exit energy (low in comparison with the energies to which the particles are subsequently accelerated), leave the electrode arrangement in the opposite direction to the primary beam, for example as a substantially parallel bundle of rays. The electrode arrangement therefore acts as an objective lens for the primary beam and as an emission lens for the secondary particles. Two instances must moreover be distinguished, namely for primary and secondary particles of the same or opposite polarity of charge.

Depending on the conditions, the emission lens can produce a real intermediate image of the target spot within the electrode arrangement from the secondary particles which are emitted by this spot struck by the primary beam on the sample surface, or it can collimate the emitted secondary particles directly to form a substantially parallel bundle or beam.

An arrangement consisting of a plane conductive sample surface and spaced plane diaphragm electrodes, the apertures of which are circular and arranged coaxially along an axis, as shown in FIG. 1, can be treated analytically in a first approximation in a known manner (see, e.g., B.U. Timm: "Zur Berechnung electrostatischer Linsen" (On the design of electrostatic lenses), Zeitschrift fur Naturforschung (Journal for scientific Research) 10a (1955), pages 593 to 603) with transfer matrices. The matrix transfer function of the diaphragm-field section combination is, for the primary particle path, $$\begin{bmatrix} r_{i-1} \\ r'_{i-1} \end{bmatrix}_p = [M_i] \begin{bmatrix} r_i \\ r'_i \end{bmatrix}_p \quad i = n \ldots 1 \tag{1}$$

with the transfer matrix $$[M_i] = \begin{bmatrix} 1 - \dfrac{1}{f_{pi}} & \dfrac{2d_i}{1 + \sqrt{(V_p \pm V_{i-1})/(V_p \pm V_i)}} & \dfrac{2d_i}{1 - \sqrt{(V_p \pm V_{i-1})/(V_p \pm V_i)}} \\ -\dfrac{1}{f_{pi}} & \sqrt{\dfrac{V_p \pm V_i}{V_p \pm V_{i-1}}} & \sqrt{\dfrac{V_p \pm V_i}{V_p \pm V_{i-1}}} \end{bmatrix} \tag{2}$$

-continued where $$\frac{1}{f_{pi}} = \frac{1}{4}\left[\frac{1}{d_i}\left(\frac{V_p \pm V_{i-1}}{V_p \pm V_i} - 1\right) + \frac{1}{d_{i+1}}\left(\frac{V_p \pm V_{i+1}}{V_p \pm V_i} - 1\right)\right] \quad (3)$$

The signs of the accelerating potential $V_p$ and the diaphragm potential $V_i$ are always positive; the kinetic energy of the primary beam particles on passing through the diaphragm $B_i$ has the value $/e/$ $(V_p \pm V_i)$, the plus sign being applicable in the case of primary and secondary particles of the same polarity and the minus sign being applicable with opposite polarity (e=elementary charge); the kinetic energy of the secondary particles in each case is $/e/$ $V_i$.

Consequently, the complete transfer matrix for the primary particle paths from the diaphragm $B_n$ to the sample surface PO becomes the product of all the individual matrices $[M_i]$ $$\prod_{i=n}^{1} [M_i] \equiv [P] = \begin{bmatrix} p_{11} & p_{12} \\ p_{21} & p_{22} \end{bmatrix} \quad (4)$$

and $$\begin{bmatrix} r_o \\ r'_o \end{bmatrix}_p = [P]\begin{bmatrix} r_n \\ r'_n \end{bmatrix}_p \quad (4a)$$

The requirement that a parallel bundle of particle rays entering close to the axis should be focused on the sample surface is fulfilled by $$p_{11} = 0 \quad (5).$$

The focal length $f_p$ of the objective lens found in this way is then $f_p = -1/p_{21}$.

For the secondary particle paths, the matrix transfer function of a field section-diaphragm part is $$\begin{bmatrix} r_i \\ r'_i \end{bmatrix}_s = [N_i]\begin{bmatrix} r_{i-1} \\ r'_{i-1} \end{bmatrix}_s \quad i = 1 \ldots n \quad (6)$$

with the transfer matrix $$[N_i] = \begin{bmatrix} 1 & \dfrac{2d_i}{1 + \sqrt{V_i/V_{i-1}}} \\ -\dfrac{1}{f_i}\sqrt{\dfrac{V_{i-1}}{V_i}} & -\dfrac{1}{f_i}\dfrac{2d_i}{1 + \sqrt{V_i/V_{i-1}}} \end{bmatrix} \quad (7)$$

wherein $$\frac{1}{f_i} = \frac{1}{4}\left[\frac{1}{d_i}\left(\frac{V_{i-1}}{V_i} - 1\right) + \frac{1}{d_{i-1}}\left(\frac{V_{i+1}}{V_i} - 1\right)\right] \quad (8)$$

The complete transfer matrix for the secondary particle paths from the sample surface PO to the last diaphragm $B_n$ is then the product of all the individual matrices $[N_i]$:

$$\prod_{i=1}^{r} [N_i] \equiv [S] = \begin{bmatrix} s_{11} & s_{12} \\ s_{21} & s_{22} \end{bmatrix} \quad (9)$$

The following applies:

$$\begin{bmatrix} r_n \\ r'_n \end{bmatrix}_s = [S]\begin{bmatrix} r_o \\ r'_o \end{bmatrix}_s \quad (9a)$$

The requirement that a beam of secondary particles, which is emitted into the half space with small initial energy $/e/$ $V_o$ ($<</e/$ $V_i$) from a point of the sample close to the axis, should leave the diaphragm $B_n$ as a parallel bundle is fulfilled by $$s_{22} = 0 \quad (10).$$

The focal length $f_s$ of the emission lens defined in this way is $f_s = -1/s_{21}$.

The imaging properties are completely determined in a first approximation by the potential curve along the axis. In the above-described method of solution, the potential along the axis is a polygon line consisting of straight sections and bends.

In principle, any desired potential curve along the axis, even if it is produced by electrodes open around the axis which are shaped in any way with rotational symmetry, can be approximated by such a polygon line which is sufficiently finely subdivided and be treated or processed in the above-described manner.

In the present combined objective and emission lens, the conditions $p_{11} = 0$ and $s_{22} = 0$ must be fulfilled at the same time. For fulfulling these conditions, there are available as variables the number n of electrodes, the distances $d_i$ between successive electrodes, the applied operating potentials $V_i$ of the respective electrodes $B_i$ and the entry energy $/e/$ $(V_p \pm V_n)$ of the primary ions. Field-free drift sections of distances may also be present, i.e. $V_i = V_{i-1}$. Preferred solutions are those where, in addition to the fulfillment of the two above-mentioned conditions, still more requirements are more or less satisfactorily met, for example the image aberrations are small.

EXAMPLES OF SOLUTION

I. Particles of opposite polarities

In this case, therefore, the primary particles may be positive and the secondary particles negative or the primary particles may be negative and the secondary particles positive.

For this case, as shown in FIGS. 2 and 3, there are solutions with only two electrodes (n=2). The condition $p_{11} = 0$ in this case is explicitly $$\left[1 + \frac{1}{2} \frac{1 - V_p/(V_p - V_1)}{1 + \sqrt{V_p/(V_p - V_1)}}\right] \left[1 + \frac{1}{2} \frac{1 - (V_p - V_1)/(V_p - V_2)}{1 + \sqrt{(V_p - V_1)/(V_p - V_2)}}\right] + \quad (11)$$

$$\frac{3d_1}{4d_2} \frac{1 - (V_p - V_1)/(V_p - V_2)}{1 + \sqrt{(V_p - V_1)/(V_p - V_2)}} \frac{1 - (V_p - V_2)/(V_p - V_1)}{1 + \sqrt{V_p/(V_p - V_1)}} = 0.$$

The condition $s_{22} = 0$ is explicitly $$\frac{d_1}{d_2}\left(1 - \frac{V_1}{V_2}\right) + \quad (12)$$

$$\left[\frac{d_1}{d_2}\left(1 - \frac{V_2}{V_1}\right) + 3\right]\left[\frac{1}{2} \frac{1 - V_1/V_2}{1 + \sqrt{V_2/V_1}} + \sqrt{\frac{V_1}{V_2}}\right] = 0.$$

A solution for Equation (12) is $d_1/d_2 = \frac{3}{4}$; $V_1/V_2 = 4$. If these values are inserted in Equation (11), it can be solved by suitable choice of $V_p$. In the case of the system represented in FIG. 2, the solution is $V_p = 5\ V_2$.

Another solution of Equation (12) is $d_1/d_2 = \frac{1}{3}$; $V_1/V_2 = 6.56$. When this is inserted in Equation (11), it gives the solution of Equation (11) as $V_p = 7.63\ V_2$. This system is represented in FIG. 3.

Arrangements with $n = 3$ and a field-free drift section following on the electrode located nearest to the sample surface can be embodied by three thin apertured diaphragms $B_1$, $B_2$ and $B_3$, the first and second of which are at the same potential. Instead of the thin apertured diaphragm electrodes at the same potential which are arranged at an axial interval $d_2$, it is also possible to employ a single thick diaphragm electrode with the thickness $d_2$ as shown in FIG. 4. The condition $p_{11} = 0$ is in this case explicitly (with $V_2 = V_1$):

$$\left[1 + \frac{1}{2} \frac{1 - V_p/(V_p - V_1)}{1 + \sqrt{V_p/(V_p - V_1)}}\right] \left\{1 + \frac{1}{2} \frac{1 - (V_p - V_1)/(V_p - V_3)}{1 + \sqrt{(V_p - V_1)/(V_p - V_3)}}\left[1 + \frac{3d_2}{4d_3}\left(1 - \frac{V_p - V_3}{V_p - V_1}\right)\right]\right\} + \quad (13)$$

$$\frac{3d_1}{4d_3} \frac{1 - (V_p - V_1)/(V_p - V_3)}{1 + \sqrt{(V_p - V_1)/(V_p - V_3)}} \frac{1 - (V_p - V_3)/(V_p - V_1)}{1 + \sqrt{V_p/(V_p - V_1)}} = 0.$$

The condition $s_{22} = 0$ is as follows:

$$\left(\frac{d_1}{d_3} + \frac{3d_2}{4d_3}\right)\left(1 - \frac{V_1}{V_3}\right) + \left[\left(\frac{d_1}{d_3} + \frac{3d_2}{4d_3}\right)\left(1 - \frac{V_3}{V_1}\right) + 3\right]\left[\frac{1}{2} \frac{1 - V_1/V_3}{1 + \sqrt{V_3/V_1}} + \sqrt{\frac{V_1}{V_3}}\right] = 0. \quad (14)$$

A solution of the two conditions, which is shown in FIG. 4, is:

$d_1 = d_3$; $d_2/d_3 = 4/9$; $V_1/V_3 = 4$; $V_p = 4.9\ V_3$.

II. Particles of the same polarity

In this case, therefore, the primary and secondary particles are both positive or both negative.

If we also start here in the first place from an electrode system with only two electrodes $B_1$, $B_2$, the condition $p_{11} = 0$ is now explicitly $$\left[1 + \frac{1}{2} \frac{1 - V_p/(V_p + V_1)}{1 + \sqrt{V_p/(V_p + V_1)}}\right] \left[1 + \frac{1}{2} \frac{1 - (V_p + V_1)/(V_p + V_2)}{1 + \sqrt{(V_p + V_1)/(V_p + V_2)}}\right] + \quad (15)$$

$$\frac{3d_1}{4d_2} \frac{1 - (V_p + V_1)/(V_p + V_2)}{1 + \sqrt{(V_p + V_1)/(V_p + V_2)}} \frac{1 - (V_p + V_2)/(V_p + V_1)}{1 + \sqrt{V_p/(V_p + V_1)}} = 0.$$

If we choose a) the interval ration $d_1/d_2 = 4/3$ (as in the first Example, and b) $V_p = 3\ V_2$ (this gives the same entry energy as in the Example according to FIG. 2, namely $4eV_2$, since the entry energy in the case of like signs is equal to $e(V_p + V_2)$ and in the case of opposite signs is $e(V_p - V_2)$, then we find as a solution of Equation (15) $V_p = 0.21\ V_1$.

With this solution for $p_{11} = 0$, there is, however, no solution for $s_{22} = 0$. If, however, the path of the secondary particles is calculated, it is found that a short distance behind the second diaphragm (reckoned from the sample surface) an image of the emitting spot of the sample is created. If now a einzel lens consisting of three more diaphragm electrodes $B_3$–$B_5$ is so arranged behind this image point, as seen from the sample surface, that the said image is located in its focal plane, the divergent beam of secondary particles emanating from the image is collimated by this einzel lens into a parallel bundle of rays. The second condition $s_{22} = 0$ is now also fulfilled for the whole electrode arrangement now consisting of five diaphragm electrodes. An arrangement of this kind is represented in FIG. 5. A primary particle path PS and a secondary particle path ST are represented, the horizontal coordinate of these particle pathes PS and ST being greatly magnified in comparison with the representation of the electrodes for the sake of clarity. The five diaphragm-like electrodes are designated by references $B_1$ to $B_5$. The image of the spot PF of the sample is produced at the point BP by the electrodes $B_1$ and $B_2$. The einzel lens consists of the electrodes $B_3$, $B_4$ and $B_5$.

The effect of the additional einzel lens $B_3$ to $B_5$ on the primary beam PS is very small because of the much greater energy of the primary beam and, if necessary, can be taken into account by slight alteration of the accelerating voltage $V_p$ of the primary particles.

As in Case I, further practical solutions are also possible in this instance.

III. Arrangements which can be changed over for particles optionally of opposite or the same polarity With certain electrode arrangements, it is possible with the same electrode arrangement, to optionally fulfill the two conditions $p_{11}=0$ and $s_{22}=0$ both for primary and secondary particles of opposite and of the same polarity, in that only the potentials or a part of the potentials of the electrodes have to be changed over. An example of such an embodiment of the invention is shown in FIGS. 6a and 6b.

Figure 6B:
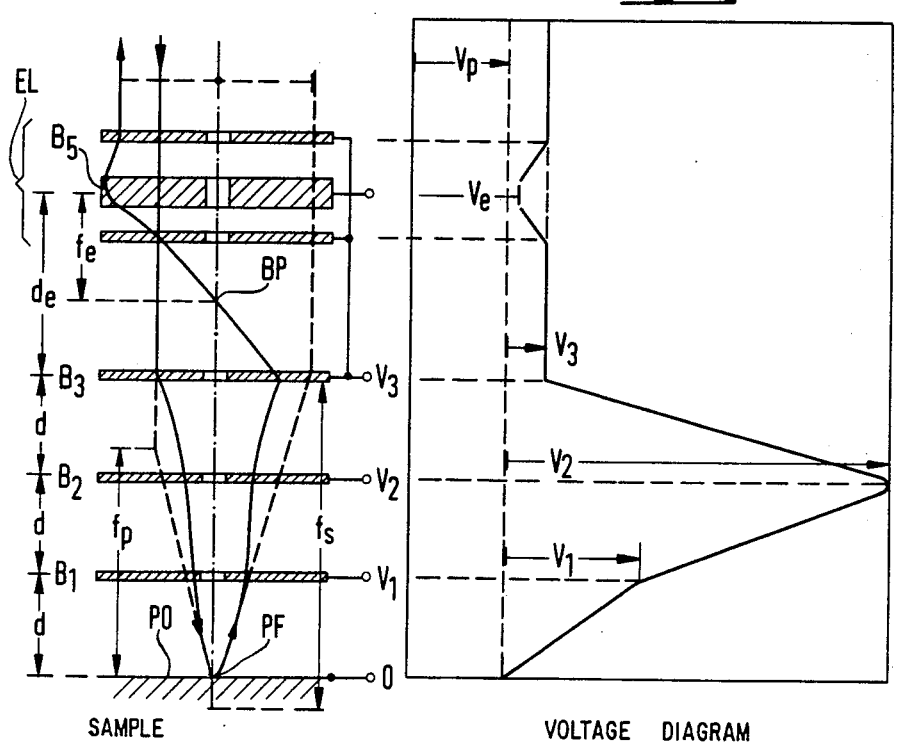

The combined objective and emission lens according to FIGS. 6a and 6b consists of three electrodes $B_1$, $B_2$, $B_3$ and a einzel lens EL. The interval between the electrode $B_1$ and the sample surface an the intervals between adjacent electrodes $B_1$, $B_2$, $B_3$ are each equal to d.

The conditions for particles of opposite polarities are shown in FIG. 6a. The electrodes of the einzel lens are at the potential $V_3$ of the electrode $B_3$ and the einzel lens is therfore not activated. The potentials of the electrodes $V_1$-$V_3$, referred to the accelerating voltage $V_p$ of the primary particles, are:

$$V_p = 4.5 \ V_3$$

$$V_1 = V_2 = 3.55 \ V_3.$$

The focal length $f_p$ for the primary particles is 1.9 d, the focal length $f_s$ for the secondary particles is 3.3 d.

For particles of the same polarity, for which the conditions are shown in FIG. 6b, the condition or requirement $p_{11}=0$ is fulfilled by $V_p=2.5 \ V_3$; $V_1=3.55 \ V_3$; $V_2=10 \ V_3$; the focal length $f_p$ is 2.26 d.

The principal plane of the einzel lens is at a distance $d_e = 1.83$ d from the electrode $B_3$.

The condition $s_{22}=0$ is fulfilled by activation of the middle electrode $B_5$ of the einzel lens by $V_e$, which is so chosen that image BP of the spot PF of the sample, which is produced at the distance 0.76 d behind the diaphragm $B_3$, coincides with the focal plane of the einzel lens EL.

The example according to FIGS. 6a and 6b is so chosen that in both cases the entry energy of the primary particles is the same, namely $e(V_p \pm V_3) = 3.5 \ eV_3$, the field strength on the sample surface is the same, namely 3.55 $V_3$/d, and the focal length $f_s$ of the emission lens part of the present combined lens is the same, namely $F_s = 3.3$ d.

In practice, in the embodiment according to FIG. 5, the following parameters can be employed: $V_2=1$ kV and $d_1=2$ mm, and, in the embodiment according to FIGS. 6a and 6b, $V_1=7.1$ kV; $V_3=2$ kV and d=1 mm; the other parameters result from the respectively indicated relationships.

Although not shown in the drawings, it is understood that in the case of employment of the combined lens according to the invention in a microbeam probe, there is arranged, in a known manner, behind the combined lens, regarded from the sample surface, a deflecting system which deflects the bundle of secondary rays emerging from the combined lens out of the path of the bundle of primary rays entering the combined lens from a source of primary rays and leads it to a mass spectrometer, energy analyser or some other apparatus for examining the bundle of secondary rays. Such an arrangement is known, for example, from the already mentioned Federal Republic of Germany Published Patent Application No. 22 23 367.

It will be understood that the above description of the present invention is susceptible to various modifications, changes and adaptations, and the same are intended to be comprehended within the meaning and range of equivalents of the appended claims.

What is claimed is:

1. In a combined objective and emission lens system for a particle-optical instrument, such as a microbeam probe for SIMS, with said system comprising a plurality of electrodes coupled in each case to a source of potential so that, in cooperation with a conductive sample surface, said system focuses a bundle of primary rays on a small spot of the sample surface and collimates the secondary particles emitted by this spot into a bundle of secondary rays which leaves the electrode system in a direction substantially opposite to the bundle of primary rays; the improvement wherein said system includes:

(a) a first electrode arrangement disposed adjacent the sample surface and having a first electrode ($B_1$) which is immediately opposite the sample surface at a first given distance ($d_1$) and at least a second electrode ($B_2$) arranged at a given second distance ($d_2$) from said first electrode ($B_1$) on the side of said first electrode facing away from the sample surface, a first potential ($V_1$) applied to said first electrode such that the electric field strength between said first electrode and the sample surface is at least about 40% of the vacuum breakdown field strength, a second potential ($V_2$) with respect to the sample surface applied to said second electrode, and said first and second distances ($d_1$, $d_2$) and said first and second potentials ($V_1$, $V_2$) are so proportioned that the bundle of primary rays accelerated by a given accelerating voltage ($V_p$) is focused on a spot (PF) of the sample surface and the bundle of secondary rays emanating from this spot is focused into an intermediate image (BP) in an image plane located on that side of said first electrode arrangement which faces away from the sample surface, at a close distance from the last electrode of said first electrode arrangement; and (b) a second electrode arrangement forming an einzel lens (EL) whose focal plane, on the side where the sample surface is located, coincides substantially with said image plane of said intermediate image (BP).

2. A combined lens system according to claim 1, wherein: said first electrode arrangement contains only two electrodes ($B_1$, $B_2$); $d_1/d_2$ is equal to 4/3; $V_2 = V_p/3$; and $V_1 = V_p/0.21$, where $V_p$ is the accelerating voltage of the primary beam particles.

3. A combined lens system according to claim 1, wherein said first and second electrode arrangements are disposed so that the potentials of said electrodes of said first and second electrode arrangements can be selectively changed to cause the einzel lens to be optionally inoperative for primary and secondary particles of opposite polarities and said first electrode arrangement to focus the primary particles on the sample surface and to collimate the secondary particles into a substantially parallel bundle or rays, or to cause, for primary and secondary particles of the same polarity, said first electrode arrangement to focus the primary particles, which are not subsantially affected by the now energized einzel lens (EL), on the sample surface and to focus the secondary particles emanating from the sample surface in said image plane between said first electrode arrangement and said einzel lens (EL), and said einzel lens to collimate the secondary particles diverging from said image plane into a substantially parallel bundle of rays.

4. A combined lens system according to claim 3, wherein said first electrode arrangement contains three electrodes with said first distance ($d_1$) being equal to said second given distance ($d_2$) and with the third said electrode ($B_3$) of said first electrode arrangement being arranged at said first given distance from said second electrode ($B_2$), said focal plane of said einzel lens (EL) is at a given second distance ($d_e$) from said third electrode ($B_3$) which is equal to 1.83 times said first given distance ($d_1$).

5. A combined lens system as defined in claim 4, wherein: the primary and secondary particles are of opposite polarities; said electrodes of said einzel lens are at the potential ($V_3$) of said third electrode ($B_3$) of said first electrode arrangement; and the potentials of said electrodes of said first electrode arrangement, referred to the accelerating voltage ($V_p$) of the primary particles, are as follows:

$V_p = 4.5\ V_3$, and $V_1 = V_2 = 3.55\ V_3$.

6. A combined lens as defined in claim 4, wherein: the primary and secondary particles are of the same polarity; the potentials of the outer electrodes of said einzel lens are equal to the potential of said third electrode ($B_3$) of said first electrode arrangement; the potential of the middle electrode ($B_5$) of said einzel lens is chosen so that said focal plane of said einzel lens (EL), on the side where the sample is located, coincides with said plane in which said first electrode arrangement ($B_1$ to $B_3$) focuses the secondary particles emitted by the sample surface; and the potentials of said electrodes of said first electrode arrangement, relative to the accelerating voltage ($V_p$) of the primary particles are as follows:

$V_3 = V_p/2.5;\ V_1 = 3.55\ V_3$ and $V_2 = 10\ V_3$.

* * * * *